United States Patent [19]
Kim

[11] Patent Number: 6,144,230
[45] Date of Patent: Nov. 7, 2000

[54] SENSE AMPLIFIER DRIVING DEVICE

[75] Inventor: Moo Suk Kim, Kyoungi-do, Rep. of Korea

[73] Assignee: Hyundai Electronics Industries Co., Ltd., Ichon-shi, Rep. of Korea

[21] Appl. No.: 09/317,113

[22] Filed: May 24, 1999

[30] Foreign Application Priority Data

May 25, 1998 [KR] Rep. of Korea ................ 98-18884

[51] Int. Cl.[7] .................................................. G11C 7/00
[52] U.S. Cl. .................. 327/51; 365/189.07; 365/205
[58] Field of Search .................................. 327/51, 57, 52; 365/189.05, 189.08, 194, 196, 205

[56] References Cited

U.S. PATENT DOCUMENTS

| Re. 34,026 | 8/1992 | Duvvury et al. | 365/205 |
| --- | --- | --- | --- |
| 5,119,333 | 6/1992 | Seo | 365/189.05 |
| 5,251,176 | 10/1993 | Komatsu | 365/222 |
| 5,430,680 | 7/1995 | Parris | 365/222 |
| 5,608,674 | 3/1997 | Yabe et al. | 365/189.05 |
| 5,815,451 | 9/1998 | Tsuchida | 365/203 |
| 6,025,331 | 4/2000 | Araki et al. | 365/233 |
| 6,067,257 | 5/2000 | Kitsukawa et al. | 365/189.11 |

Primary Examiner—Tuan T. Lam
Attorney, Agent, or Firm—Jacobson, Price, Holman & Stern, PLLC

[57] ABSTRACT

A sense amplifier driving device sequentially drives a number of sense amplifiers to reduce the peak current caused by the sensing operation. A sense amplifier driving device having first sub-sense amplifier group and second sub-sense amplifier group comprises sense amplifier enable signal generating means for receiving a word line enable signal and for generating a sense enable signal; first sense amplifier activating means for receiving the sense enable signal from the sense enable signal generating means and for controlling the activation of the first sub-sense amplifier group; delay means for receiving an output signal from the sense amplifier enable signal generating means and for delaying the output signal for a certain amount of time; and second sense amplifier activating means for receiving the output signal from the delay means and for controlling the activation of the second sub-sense amplifier group.

5 Claims, 4 Drawing Sheets

SENSE AMPLIFIER DRIVING DEVICE

BACKGROUND OF THE INVENTION

1. Field of the Invention

The present invention relates to a sense amplifier driving device of a semiconductor memory device. In particular, it relates to a sense amplifier driving device which sequentially drives a number of sense amplifiers to reduce the peak current caused by the sensing operation.

2. Description of the Prior Art

FIG. 1 is a block diagram of a conventional semiconductor memory device. As shown in diagram, since conventional sense amplifiers sense all data on the one word line selected by the row decoder, there is a problem that the operation speed of the sense amplifiers becomes longer and the peak current is increased by the progress of the high density memory device.

FIG. 2 is a block diagram which illustrates the activation process in accordance with a conventional dynamic random access memory. As shown in diagram, /RAS signal is applied to the word line enable signal generator 10, and an output signal WL_en from the word line enable signal generator 10 is applied to the sense enable signal generator 20. When a sense enable signal SE from the sense enable signal generator 20 is activated, a sense amplifer activation signal generator 30 which generates signals (rto and /s: bias supply voltages of sense amplifiers) is operated to perform a sensing operation of sense amplifiers.

In general, a sense amplifier array having a large number of sense amplifiers, for example 512 sense amplifiers, is controlled by only one pair of sense amplifier activation signals, rto and /s.

As a result, there is a problem that a sensing peak current which causes noise may be generated.

In order to solve this problem, the conventional art utilizes a technique which controls the voltage levels of signals rto and /s to reduce the peak current by degrading the sensing speed.

However, such a conventional technique which reduces the peak current by degrading the sensing speed is inefficient, and also there is a limit in reducing the sensing speed and the peak current.

SUMMARY OF THE INVENTION

Accordingly, the present invention is directed to a sense amplifier driving device of a semiconductor memory device that substantially obviates one or more of the problems due to the limitations and disadvantages of the related art.

It is an object of the present invention to provide a sense amplifier driving device which reduces the peak current and improves the sensing speed by dividing a number of sense amplifiers into a plurality of sub-groups and driving the subgroups in sequence.

According to one aspect of the present invention, there is provided a sense amplifier driving device having first sub-sense amplifier group and second sub-sense amplifier group comprising: sense amplifier enable signal generating means for receiving a word line enable signal and for generating a sense enable signal; first sense amplifier activating means for receiving the sense enable signal from the sense enable signal generating means and for controlling the activation of the first sub-sense amplifier group; delay means for receiving an output signal from the sense amplifier enable signal generating means and for delaying the output signal for a certain amount of time; and second sense amplifier activating means for receiving the output signal from the delay means and for controlling the activation of the second sub-sense amplifier group.

In one aspect of the present invention, the delay means includes first to Nth delay elements, the second sub-sense amplifier group includes first to Nth sense amplifiers corresponding to the first to Nth delay elements, and delay times of the first to Nth delay elements are different from each other.

According to another aspect of the present invention, there is provided a sense amplifier driving device having sense amplifier enable signal generating means for receiving a word line enable signal and for generating a sense enable signal; first and second sub-sense amplifier groups; first sense amplifier activating means for generating first sub-sense amplifier group activating signal which activates the first sub-sense amplifier group; second sense amplifier activating means for generating second sub-sense amplifier group activating signal which activates the second sub-sense amplifier group; first delay means for receiving a column address signal and the sense enable signal; and second delay means for receiving the column address signal and the sense enable signal, wherein the delay times of the first and second delay means are different from each other, an output signal from the first delay means is applied to the first sense amplifier activating means, and an output signal from the second delay means is applied to the second sense amplifier activating means In another aspect of the present invention, the column address signal is a most significant bit of column address bits.

These and other objects and features of the invention will become apparent from the following description of the preferred embodiments with reference to the accompanying drawings.

DETAILED DESCRIPTION OF THE PREFERRED EMBODIMENTS

A preferred embodiment of the present invention will now be described in detail with reference to the accompanying drawings.

Figure 1:
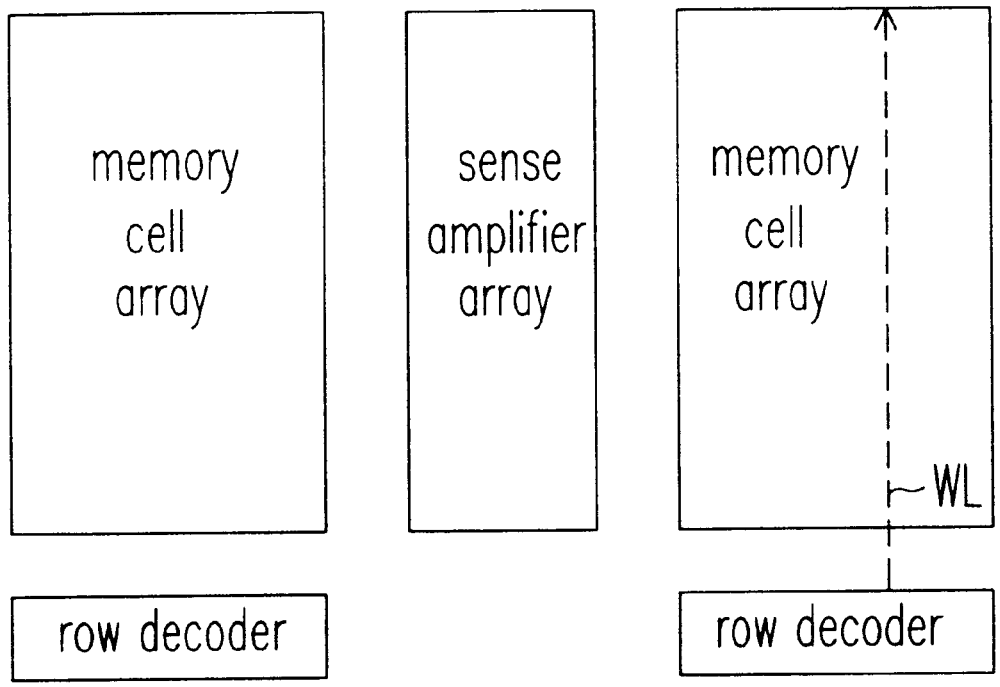
FIG. 1 is a block diagram of a conventional semiconductor memory device.
Figure 2:
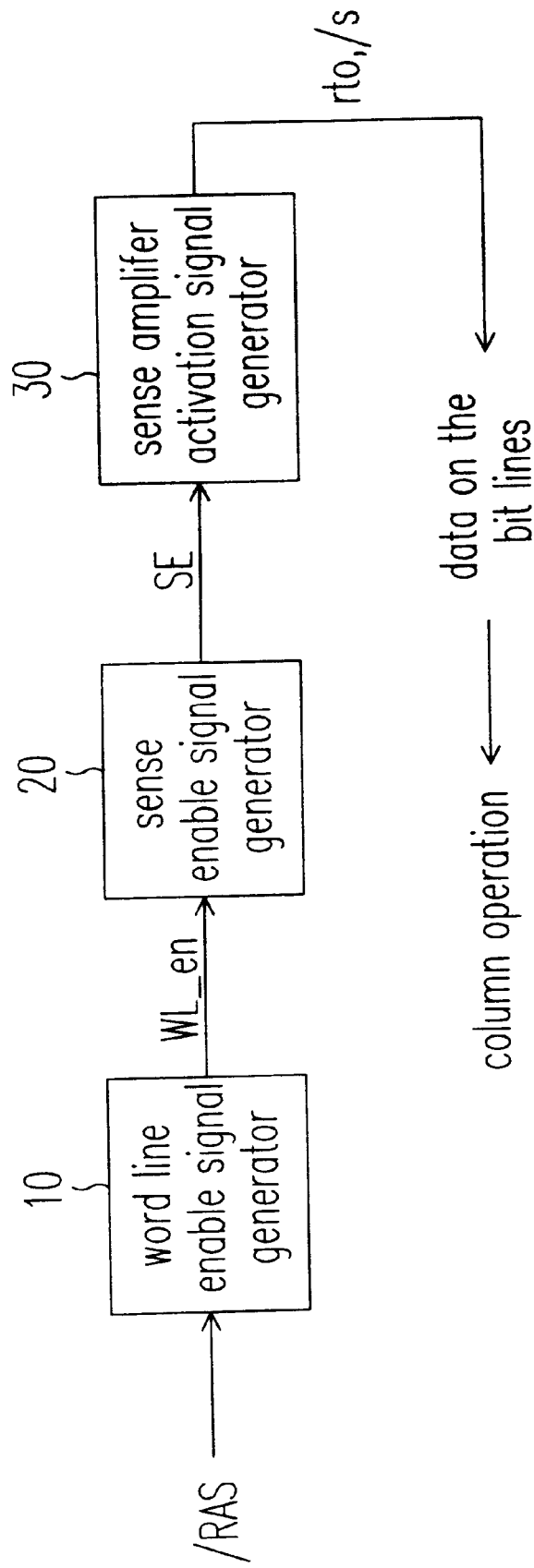
FIG. 2 is a block diagram which illustrates the activation process in accordance with a conventional semiconductor memory device.
Figure 3:
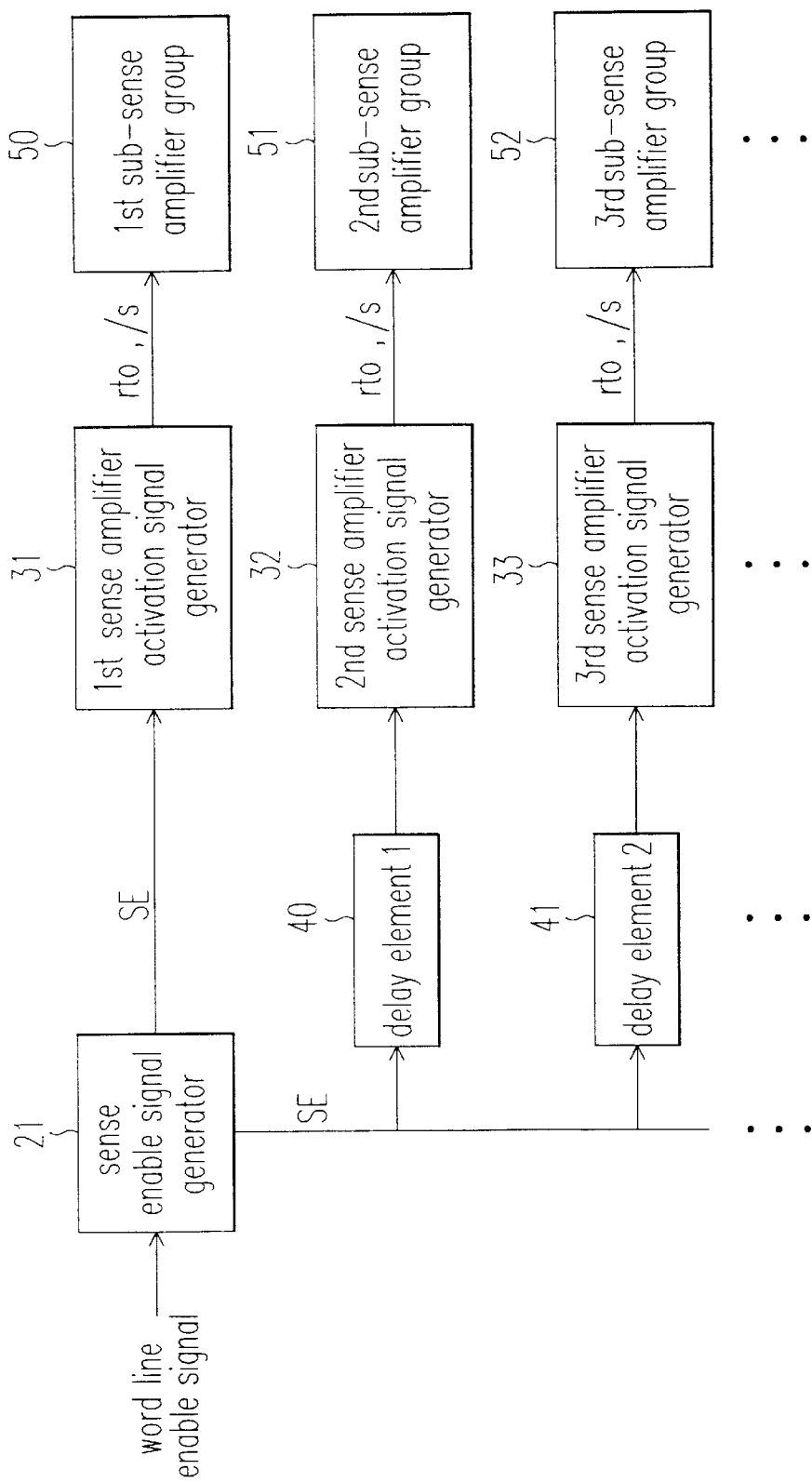
FIG. 3 is a block diagram of a sense amplifier driving device in accordance with a preferred embodiment of the present invention.

FIG. 3 is a block diagram of a sense amplifier driving device in accordance with a preferred embodiment of the present invention.

As shown in FIG. 3, the sense enable signal generator 21 receives a word line enable signal and generates a sense enable signal SE which enables a sensing operation. The sense enable signal SE is applied to the first sense amplifier activation signal generator 31 and to a number of delay elements 40, 41 . . . . The delay times of the delay elements are different from each other. The delay time of the delay element 41 is longer than that of the delay element 40. In general, each delay time of the delay elements increases sequentially. The output signal from the delay element 40 is applied to the second sense amplifier activation signal generator 32, the output signal from the delay element 41 is applied to the third sense amplifier activation signal generator 33, . . . ,etc. Therefore, the first sense amplifier activation signal generator 31 is activated in the first instance; after this, the second sense amplifier activation signal generator 32 is activated, and then the third sense amplifier activation signal generator 33 is activated, . . . , etc. The output signals rto, /s from the first to third sense amplifier activation signal generators 31, 32, and 33 are applied to the corresponding first to third sub-sense amplifier groups 50, 51, and 52.

In operation, as shown in diagram, the first sub-sense amplifier group 50 is first enabled, then the second sub-sense amplifier group 51 is enabled some time later (this time is determined by the delay element 40), and after the activation of the second sub-sense amplifier group 51, the third sub-sense amplifier group 52 is enabled. The delay time in delay element 41 is longer than that in the delay element 40. Accordingly, the sensing speed is improved and the peak current is decreased by the sequencial activation a plurality of sub-sense amplifier groups.

Figure 4:
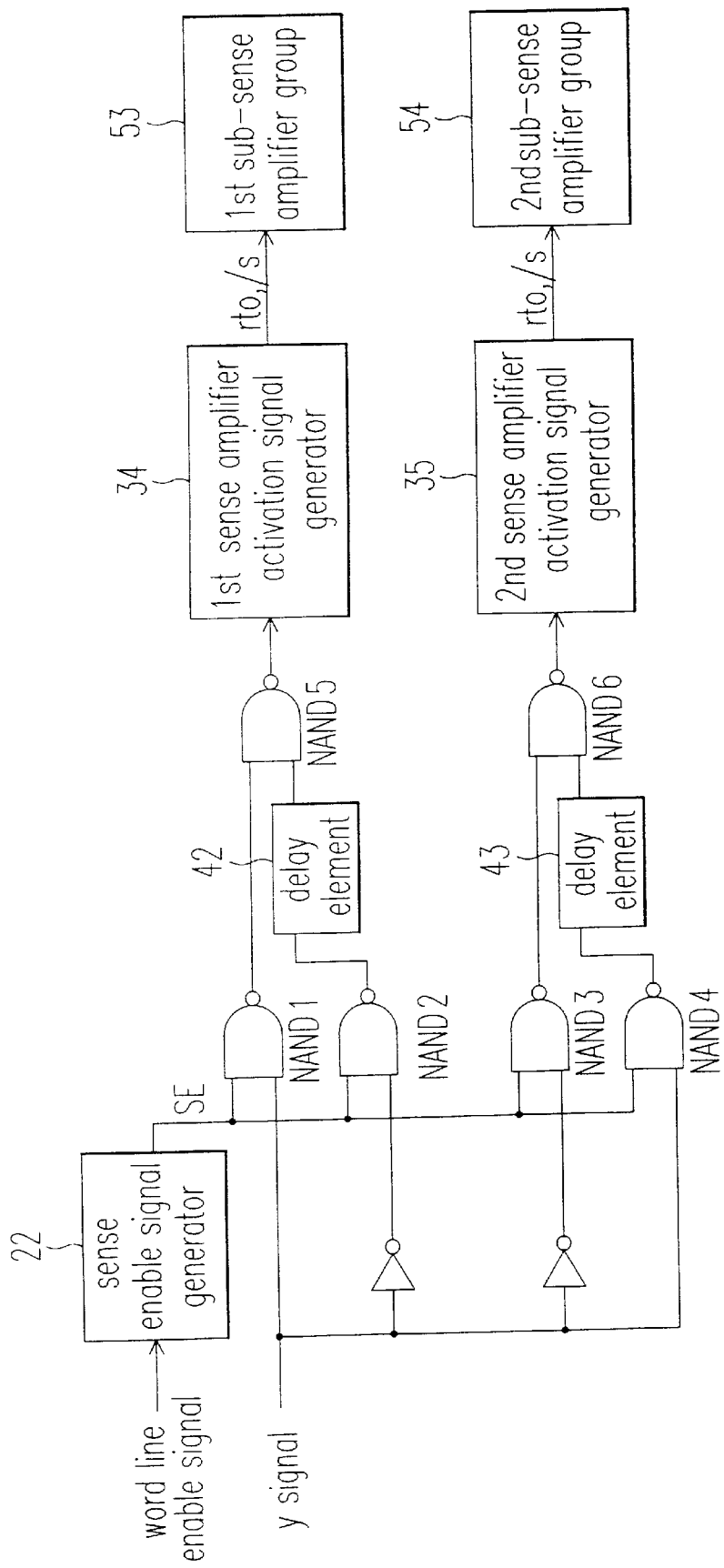
FIG. 4 is a block diagram of a sense amplifier driving device in accordance with another preferred embodiment of the present invention.

FIG. 4 is a block diagram of a sense amplifier driving device in accordance with another preferred embodiment of the present invention. Although only two sub-sense amplifier groups 53 and 54 only are shown, it is possible to divide a sense amplifier array into more than two sub-sense amplifier groups.

Hereinafter, the construction and operation of the second embodiment will be explained.

As shown in FIG. 4, the sense enable signal generator 22 receives a word line enable signal and generates a sense enable signal SE which enables a sensing operation. A column address signal y is selected from one of the column addresses. In the present embodiment, the column address signal y is the most significant bit MSB of the column addresses. A NAND element NAND1 receives both the sense enable signal SE and the column address signal y. A NAND element NAND2 receives both the sense enable signal SE and the complement /y of the column address signal y. A NAND element NAND3 receives both the sense enable signal SE and the complement /y of the column address signal y. A NAND element NAND4 receives both the sense enable signal SE and the column address signal y. The output from the NAND element NAND2 is applied to the delay element 42, and the output from the NAND element NAND4 is applied to the delay element 43. A NAND element 5 receives both the output signal from the NAND1 and the output from the delay element 42. A NAND element 6 receives both the output signal from the NAND3 and the output from the delay element 43. The output from the NAND5 is applied to the first sense amplifier activation signal generator 34, and the output from the NAND6 is applied to the second sense amplifier activation signal generator 35. The operation of the first sub-sense amplifier group 53 is activated by the output signals rto, /s from the first sense amplifier activation signal generator 34, and the operation of the first sub-sense amplifier group 54 is activated by the output signals rto, /s from the second sense amplifier activation signal generator 35. The sub-sense amplifier groups 53 and 54 are activated in sequence in response to the corresponding output signals from the sense amplifier activation signal generators. Therefore, the actvation timing of each of the sub-sense amplifier groups is different from each other. The delay elements 42 and 43 may be comprised of a even number of inverters. Each delay time period of the delay elements 42 and 43 may be identical with each other, or may be different in consideration of the device performance.

In operation, the first sub-sense amplifier group 53 is operated first by the column address y and output signal from the sense enable signal generator 22. Some time later, the second sub-sense amplifier group 54 is enabled. The delay elements 42 and 43 controls the activation timing of the first and second sense amplifier activation signal generators 34 and 35 to enable in sequence the operation of the first and second sub-amplifier groups 53 and 54. In general, the second sub-sense amplifier group 54 may be operated during the operation of the first sub-sense amplifier group 53. However, the operation timing between the first and second sense amplifier activation signal generators 34 and 35 is different from each other.

As described above, sense amplifier activation signal generators 34 and 35 are independently operated, and are sequentially activated in response to the one bit of the column address. In general, when the /RAS is disabled, the sensing operation is stopped.

By the above illustrated construction and operation, the present invention can reduce the peak current in the sensing operation of the memory device, and it also enables a high speed sensing operation.

Further, the present embodiments can be applicable to the data bus sense amplifiers by dividing them into a number of sub-groups in order to reduce the peak current.

As described above, a sense amplifier driving device according to the present invention can reduce the sensing peak current which causes noise in a memory device and can improve the reliabilty of the device. Further, the present invention can enable a stable and high speed sensing operation by reducing the peak current. Therefore, it is applicable to the Rambus DRAM or SDRAM, etc. which requires a high speed sensing operation.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A sense amplifier driving device having first sub-sense amplifier group and second sub-sense amplifier group comprising:

sense amplifier enable signal generating means for receiving a word line enable signal and for generating a sense enable signal;

first sense amplifier activating means for receiving the sense enable signal from the sense enable signal generating means and for controlling the activation of the first sub-sense amplifier group;

delay means for receiving the sense enable signal and for delaying the sense enable signal for a certain amount of time; and second sense amplifier activating means for receiving the output signal from the delay means and for controlling the activation of the second sub-sense amplifier group.

2. The sense amplifier driving device as set forth in claim 1, wherein the delay means includes first to Nth delay elements, the second sub-sense amplifier group includes first to Nth sense amplifiers corresponding to the first to Nth delay elements, and delay times of the first to Nth delay elements are different from each other.

3. The sense amplifier driving device as set forth in claim 2, wherein the each delay time of the first to Nth delay elements increases sequentially.

4. A sense amplifier driving device comprising:

sense amplifier enable signal generating means for receiving a word line enable signal and for generating a sense enable signal;

first and second sub-sense amplifier groups;

first sense amplifier activating means for generating first sub-sense amplifier group activating signal which activates the first sub-sense amplifier group;

second sense amplifier activating means for generating second sub-sense amplifier group activating signal which activates the second sub-sense amplifier group;

first delay means for receiving a column address signal and the sense enable signal; and second delay means for receiving the column address signal and the sense enable signal, wherein the delay times of the first and second delay means are different each other, an output signal from the first delay means is applied to the first sense amplifier activating means, and an output signal from the second delay means is applied to the second sense amplifier activating means.

5. The sense amplifier driving device as set forth in claim 4, wherein the column address signal is a most significant bit of column address bits.

* * * * *